United States Patent
Park et al.

(10) Patent No.: US 6,714,466 B2
(45) Date of Patent: Mar. 30, 2004

(54) SYSTEM OF PERFORMING A REPAIR ANALYSIS FOR A SEMICONDUCTOR MEMORY DEVICE HAVING A REDUNDANT ARCHITECTURE

(75) Inventors: Sang Wook Park, Seoul (KR); Joo Hyung Mun, Kyoungki-do (KR); Hyeok Man Kwon, Kwangju-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 59 days.

(21) Appl. No.: 10/080,710

(22) Filed: Feb. 25, 2002

(65) Prior Publication Data

US 2002/0159310 A1 Oct. 31, 2002

(30) Foreign Application Priority Data

Feb. 27, 2001 (KR) .......................................... 2001-10097

(51) Int. Cl.[7] ............................ G11C 7/00; G11C 15/00; G11C 8/00; G11C 29/00
(52) U.S. Cl. .................... 365/200; 365/49; 365/189.02; 365/189.05; 365/189.07; 365/189.08; 365/201; 365/230.02; 365/230.06; 365/230.08
(58) Field of Search .................. 365/200, 49, 189.02, 365/189.05, 189.07, 189.08, 201, 230.02, 230.06, 230.08

(56) References Cited

U.S. PATENT DOCUMENTS

| 5,293,386 | A | * | 3/1994 | Muhmenthaler et al. ..... 714/718 |
| 5,477,492 | A | * | 12/1995 | Ohsaki et al. ............... 365/200 |
| 5,561,627 | A | * | 10/1996 | Matsubara et al. .... 365/185.04 |
| 5,680,544 | A | * | 10/1997 | Edmondson et al. ......... 714/42 |
| 5,983,374 | A | | 11/1999 | Todome et al. |
| 6,166,559 | A | * | 12/2000 | McClintock et al. ......... 326/10 |
| 6,243,307 | B1 | * | 6/2001 | Kawagoe ..................... 365/201 |
| 6,324,105 | B1 | * | 11/2001 | Shirley ........................ 365/200 |
| 6,393,504 | B1 | * | 5/2002 | Leung et al. ................ 710/104 |
| 6,459,292 | B1 | * | 10/2002 | Oikawa et al. ............. 324/765 |
| 6,462,995 | B2 | * | 10/2002 | Urakawa ..................... 365/200 |
| 2002/0163840 | A1 | * | 11/2002 | Hiraki et al. ........... 365/189.05 |

FOREIGN PATENT DOCUMENTS

KR 1020010007088 1/2001

* cited by examiner

*Primary Examiner*—David Nelms
*Assistant Examiner*—Ly Duy Pham
(74) *Attorney, Agent, or Firm*—Pillsbury Winthrop LLP

(57) ABSTRACT

Two temporary buffers are employed alternatively storing a fail address data designated from a test operation, in which one of the temporary buffers transfers the fail address data to a data buffer in order to perform a repair analysis while the other one is storing the fail address data. Accordingly, the test and repair analysis operations are simultaneously performed. The capability of the rearrangement that includes the movement and exchange between the column and row fail address data enhances redundancy efficiency and yields of the memory device.

26 Claims, 15 Drawing Sheets

SYSTEM OF PERFORMING A REPAIR ANALYSIS FOR A SEMICONDUCTOR MEMORY DEVICE HAVING A REDUNDANT ARCHITECTURE

BACKGROUND OF THE INVENTION

1. Field of the Invention

The inventions described and/or claimed in this patent relate in general to a performing a repair analysis for a semiconductor memory device having a redundant architecture. More specifically, they relate to performing a repair analysis for a semiconductor memory device having a redundant architecture capable of simultaneously or synchronously performing a test and a repair analysis for semiconductor memory device and of performing a rearranging operation which moves and exchanges fail address data in a unit row and column thereby enhancing efficiency in utilizing rows and columns.

2. Description of the Background Art

In semiconductor memory devices employing a redundant architectural arrangement, operations for repairing failed memory cells have been usually carried out by an external apparatus using fail address data resulting from a test of all memory cells of the memory device.

Many semiconductor memory devices have a built-in self-test (BIST) arrangement that enables repair operations to be carried out. Such an internal repair function requires space for storing bits of data corresponding to addresses that have been tested and failed the test. This data is known as 'fail address data'. The storage of this data takes up overhead that could otherwise be used for better purposes, thus contributing to chip inefficiency.

Although a manner for repairing memory cells by testing in the unit of row (or column) has been proposed, it is impossible to perform a repair analysis of a row redundancy or a column redundancy because an algorithm of a repair analysis should be used by one of the row and column redundancy configurations with reference to patterns of fail address data (data for defective cell).

SUMMARY OF THE INVENTION

Among the inventions disclosed and/or claimed, there is provided a semiconductor memory device capable of performing a repair analysis operation synchronously with a test operation in the unit of row or column.

There is also provided a semiconductor memory device capable of enhancing efficiency of a redundancy operation by moving and exchanging fail address data in the unit of row or column the fail address data FAD stored in a CAM.

More specifically, according to at least one embodiment of the various inventions described, there is provided an arrangement for performing a repair analysis. A test unit performs a test operation in a row and column and detects defective cells. A repair analysis means performs a repair analysis operation which causes data to be moved and exchanged between the fail address data assigned to defective cells of a semiconductor memory device in the unit of row and column.

According to another aspect of the various inventions described and/or claimed herein, there is described a method of performing a repair analysis with fail address data assigned to defective cells in a system of a repair analysis. A test operation is carried out for cells of the semiconductor memory device in the unit of row and column. Fail address data for defective cells is stored into a data buffer. The fail address data stored in the data buffer is written into a storage block. Then, fail address data is moved and exchanged to complete the process.

BRIEF DESCRIPTION OF THE DRAWINGS

The present invention will become better understood with reference to the accompanying drawings that are given only by way of illustration and thus are not imitative of the present invention, wherein.

DETAILED DESCRIPTION

Figure 1:
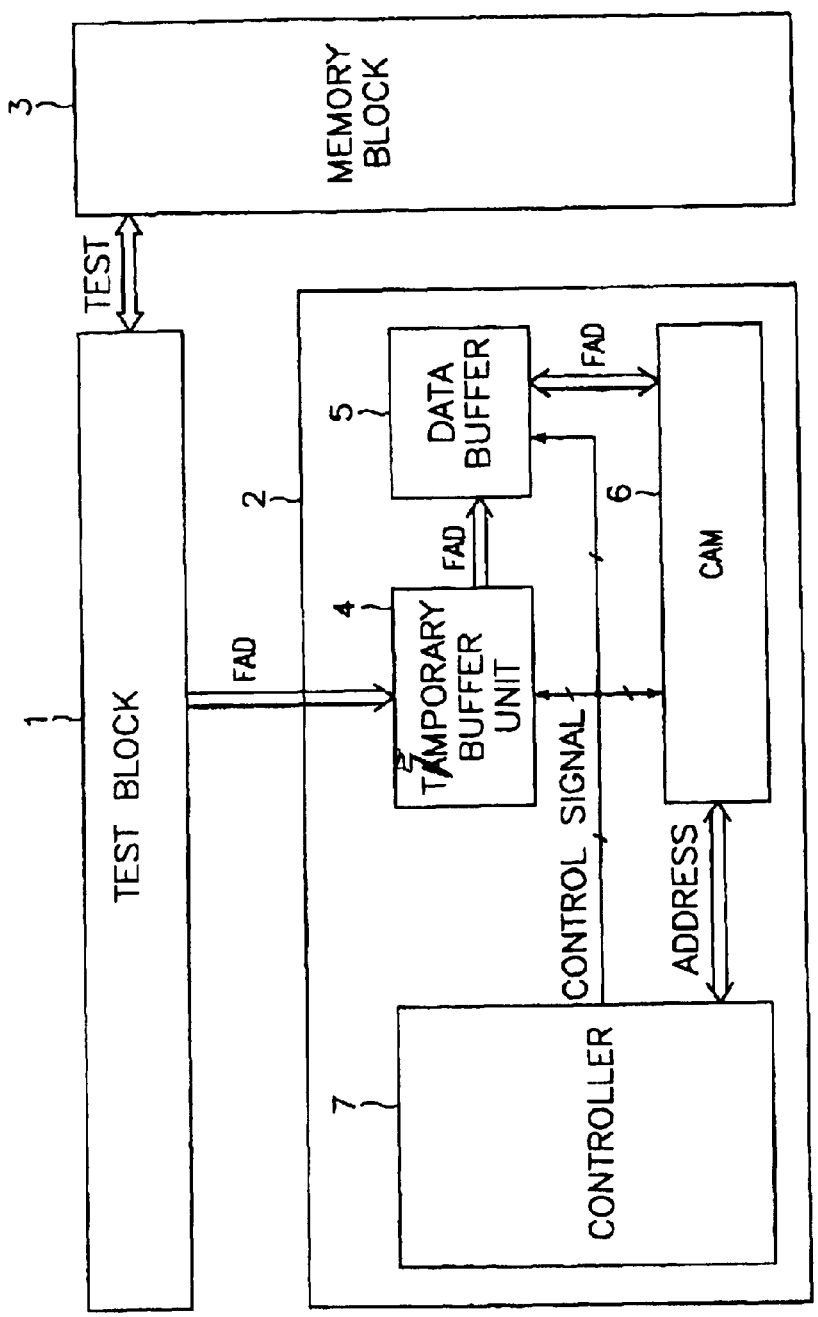
FIG. 1 is a block diagram of a system for performing a repair analysis according to an embodiment of the various inventions described and/or claimed.

FIG. 1 shows an arrangement for performing a repair analysis for a semiconductor memory device having a redundant architecture including four spare row and column lines. This is merely an exemplary arrangement. Many other configurations are possible, such as those including less than four spare row and column lines and those including more than four spare row and column lines. However, this example will provide a useful explanation of the principles of the inventions described and/or claimed herein. A test block 1 performs BIST(built-in self test) for memory cells of a memory block 3, and a repair analysis unit 2 performs a repair operation with defective address data detected by test block 1.

The repair analysis unit 2 includes a temporary buffer unit 4 for storing the fail address data FAD detected by the test block 1, a data buffer 5 for holding the fail address data FAD, a CAM (content addressable memory) 6 for storing the fail address data FAD stored in the data buffer 5, and a controller 7 for controlling the temporary buffer unit 4, the data buffer 5 and the CAM 6.

Figure 2:
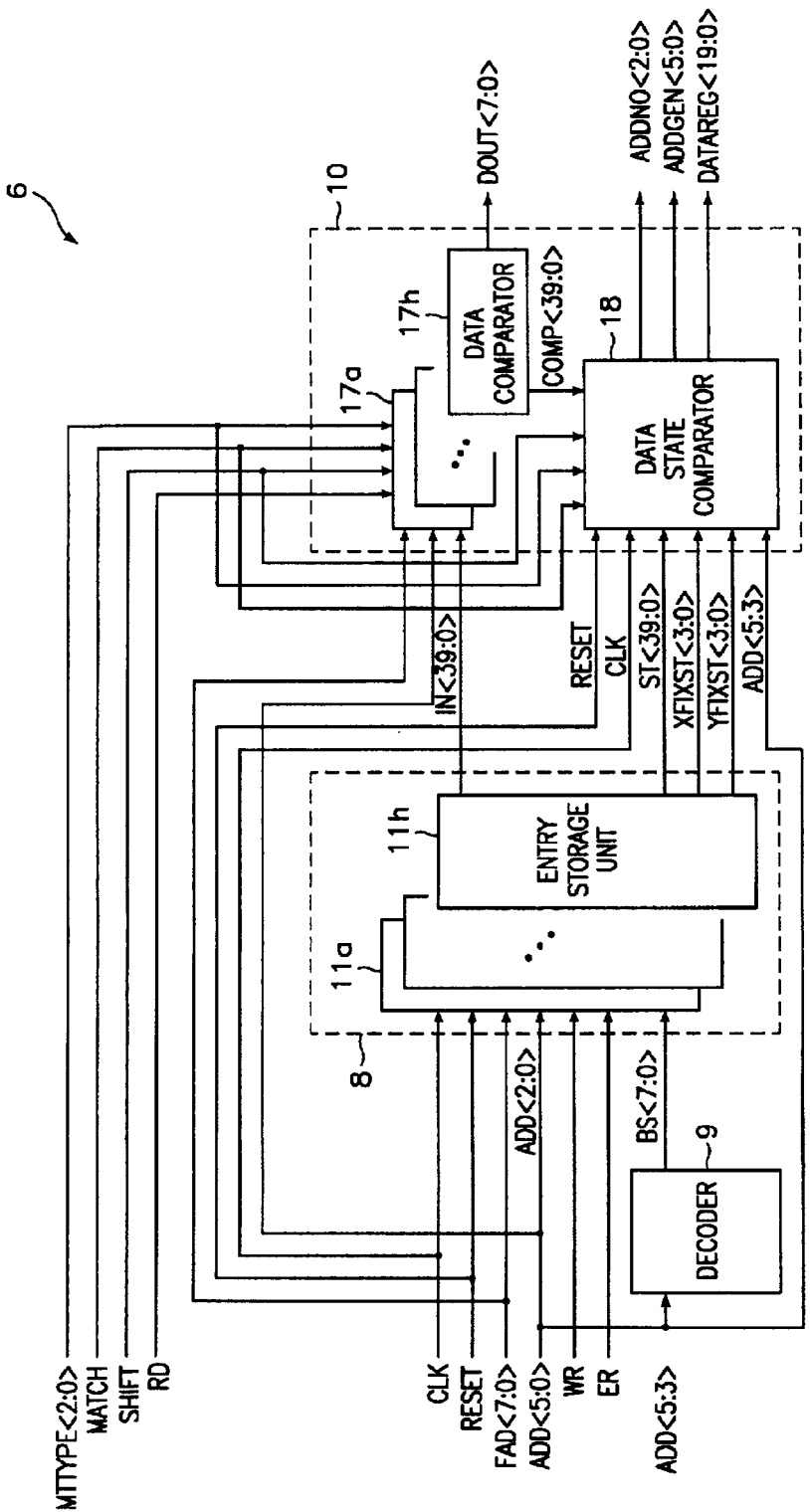
FIG. 2 is a block diagram of the CAM shown in FIG. 1.

The CAM shown in FIG. 2 includes an entry storage block 8 for storing the fail address data FAD, a decoder 9 for generating decoding signals BS<7:0> to select the entry storage units 11a~11h of the entry storage block 8 in response to address signals ADD<5:3>, and a function block 10 for generating control signals to store the fail address data FAD. The entry storage block 8 includes the eight entry storage units 11a~11h as substantial registers in the CAM 6 during the repair analysis operation.

Figure 3:
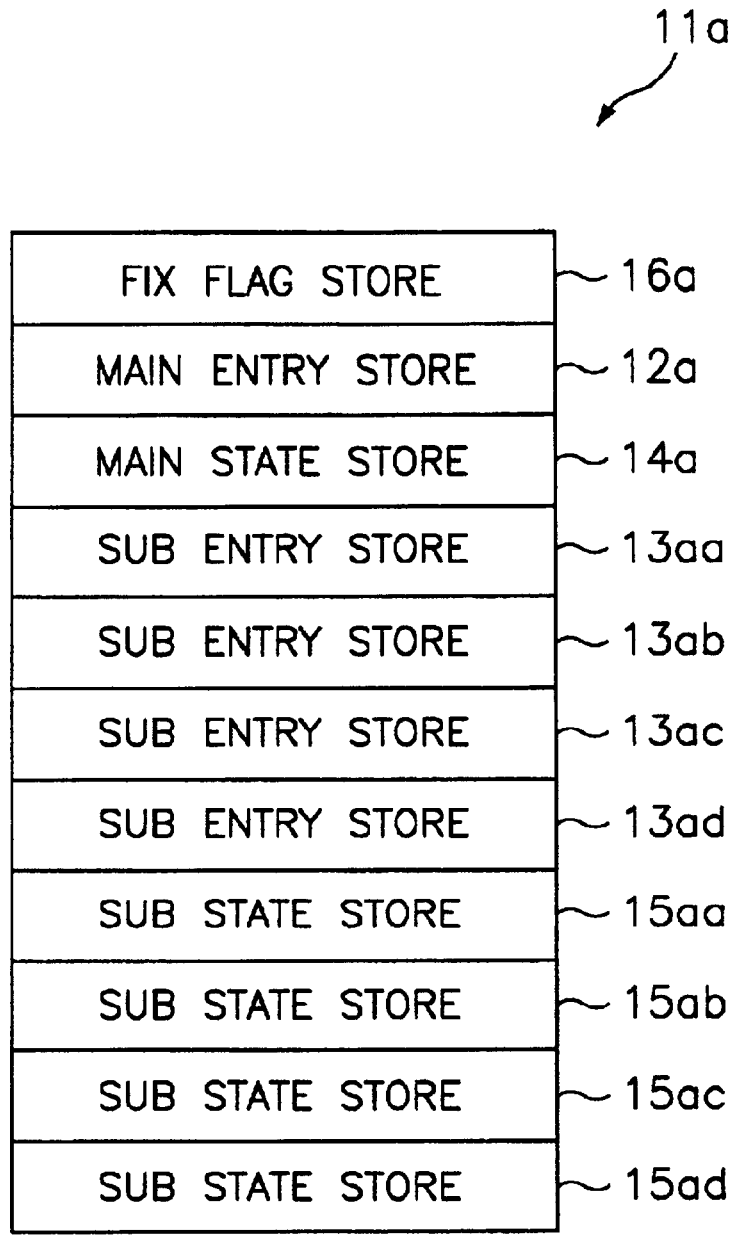
FIG. 3 is a block diagram of the entry storage block shown in FIG. 2.

FIG. 3 shows greater detail of one of the entry storage units—specifically, entry storage unit 11a. Entry storage unit 11 includes one main entry store 11a and four sub entry stores 13a~13d. The entry storage unit 11a comprises a main entry store 12a four sub entry stores 13a~13d, a main state store 14a to store a state flag representing a current state of the main entry store 12a, four sub state stores 15a~15d to store state flags representing current states of the sub entry stores 15a~15d, and a fixation flag store 16a to store a fixation flag locking up fuse lines for sub entries when the number of the fail address data FAD is larger than that of the sub entry stores. The main entry stores 12a~12d of the entry storage units 11a~11d store the fail address data FAD for row while the main entry stores 12e~12h of the rest entry registers 11e~11h store the fail address data FAD for column, during a row scan test operation.

Function block 10 includes data comparators 17a~17h (see FIG. 2) for detecting whether the fail address data FAD stored in the CAM 6 matches with the fail address data FAD stored in the data buffer 5 after a test operation, and a data state comparator 18 (see FIG. 2) for counting the number of valid entry stores and searching empty spaces for the main entry storage.

The main entry store 12a and the sub entry stores 13a~13d are associated with the address bits as shown in the following table TABLE 1.

TABLE 1

| Address Bit | Assignment | |
|---|---|---|
| 5 | 0 | Row fuse |
|   | 1 | Column fuse |
| 4 | Main fuse number | |
| 3 | | |
| 2 | 0 | Main fuse |
|   | 1 | Main fuse |
| 1 | Sub fuse number | |
| 0 | | |

For example, address bits assigned to the third entry register 11g for column is like that:

TABLE 2

| 110000 | 110100 |
|---|---|
|   | 110101 |
|   | 110110 |
|   | 110111 |

In TABLE 1, the address in the main entry store 12a is [110000] (hereinafter, "☐" means a notation of binary codes), and addresses of the sub entry stores 13a, 13b, 13c, and 13d are [110100], [110101], [110110], and [110111], respectively.

The decoder 9 generates address decoding signals BS<7:0> to select the entry storage units 11a~11h of the entry storage block 8 in response to the address bits ADD<5:3> supplied from controller 7, not being synchronized with clock signal CLK.

The data shown in the tables and described herein are merely exemplary and for the purpose of describing a concrete example. Other data arrangements are and may be appropriate under other circumstances.

Figure 4:
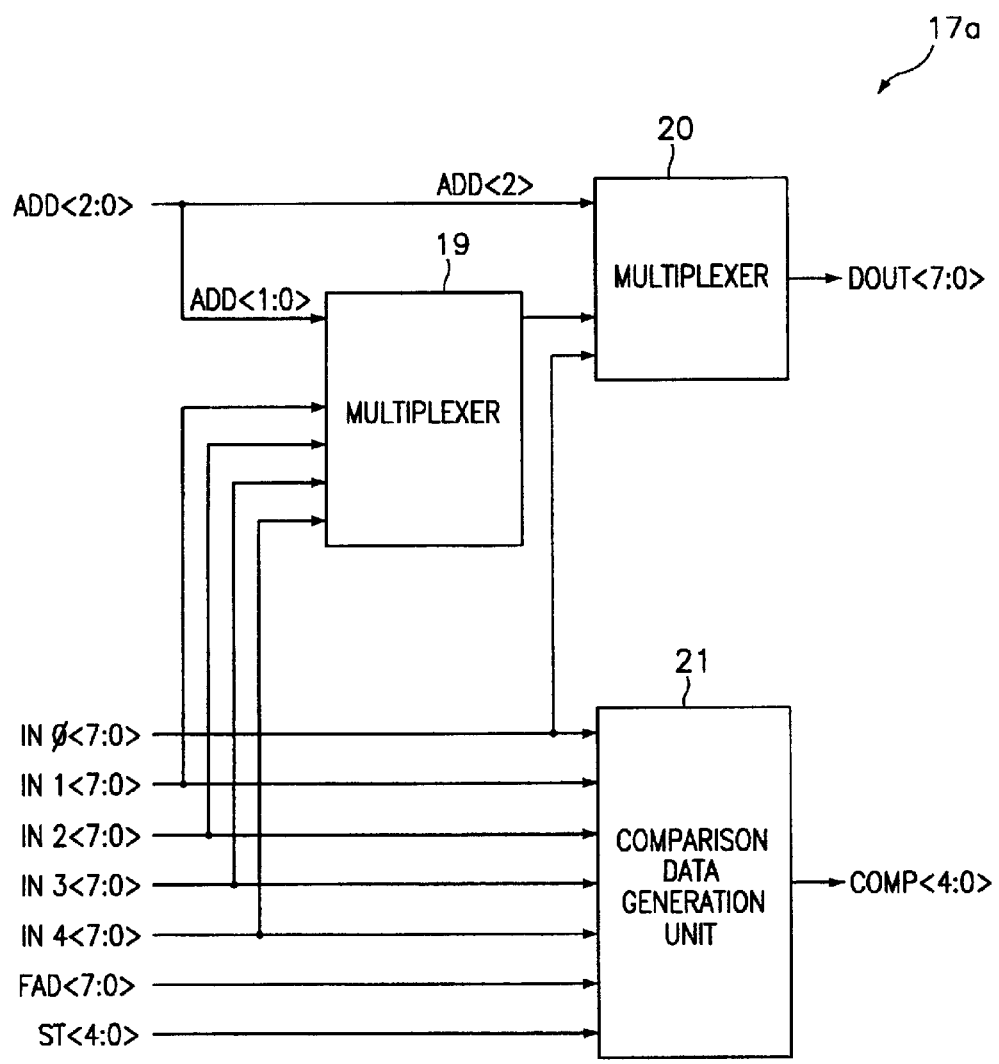
FIG. 4 is a block diagram of the data comparator shown in FIG. 2.

FIG. 4 is a block diagram of the data comparator shown in FIG. 2. The data comparator 17a includes a multiplexer 19 for selecting an alternative one of sub entry data IN1<7:0>~IN4<7:0> held in the entry storage unit selected in the CAM 6 in response to address bits ADD<1:0>, a multiplexer 20 for selecting one among an output from the multiplexer 19 and a main entry data IN0<7:0> in response to an address bit ADD<2>, and a comparison data generation unit 21 for generating comparison data COMP<4:0> made from comparing the fail address data FAD<7:0> with the entry data IN0<7:0>~IN4<7:0> in response to state data ST<4:0>.

Figure 5:
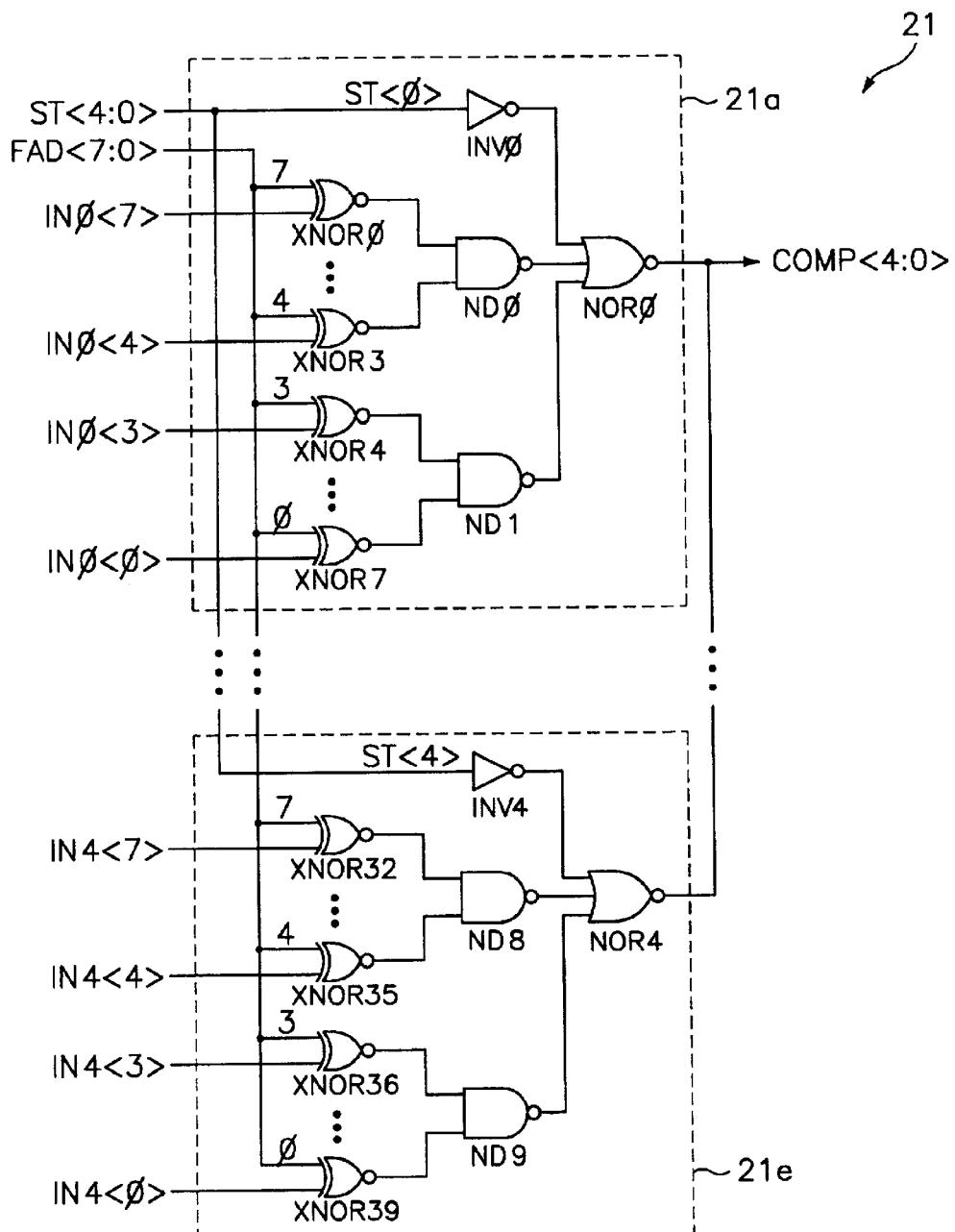
FIG. 5 is a circuit diagram of the compare data generation unit of FIG. 4.

FIG. 5 is a circuit diagram of the compare data generation unit of FIG. 4. The comparison data generation unit 21 of the data comparator 17a generates the comparison data COMP<4:0> and includes comparator units 21a~21e for combining the fail address data FAD<7:0> respectively with the entry data IN0<7:0>~IN4<7:0>. The comparator units 21a~21e have the same construction.

The first comparator unit 21a, comparing the fail address data FAD<7:0> with the main entry data IN0<7:0>, includes exclusive-NOR gates XNOR0~XNOR7 each of which receives one bit of the fail address data FAD<7:0> and one bit of the main entry data IN0<7:0>. The first comparator unit 21a comprises an NAND gate ND0 for receiving outputs from the four exclusive-NOR gates XNOR0~XNOR3, an NAND gate ND1 for receiving outputs from the rest exclusive-NOR gates XNOR4~XNOR7, an inverter INV0 for receiving the first bit of the state data ST<4:0>, and an NOR gate NR0 for receiving outputs from the inverter INV0 and the NAND gates ND0 and ND1 and outputting the first bit COMP<0> of COMP<4:0>.

Other comparator units 21b~21e compares the fail address data FAD<7:0> with the sub entry data IN1<7:0>~IN4<7:0>, such as the comparator unit 21a. Here, the comparator unit 21e comprises an exclusive-NOR gates XNOR32~XNOR39 for receiving the sub entry data IN4<7:0> corresponding to the exclusive-NOR gates XNOR0~XNOR7 of the comparator unit 21a, an NAND gate ND8 for receiving outputs from XNOR32~XNOR35 corresponding to the NAND gate ND0 of the comparator unit 21a, an NAND gate ND9 for receiving outputs from XNOR36~XNOR39 corresponding to the NAND gate ND1 of the comparator unit 21a, an inverter INV4 for receiving the fifth bit of the state data ST<4> corresponding to the inverter INV0 of the comparator unit 21a, and an NOR gate NOR4 for receiving outputs from the inverter INV4 corresponding to the NOR gate NOR0 of the comparator unit 21a.

Figure 6:
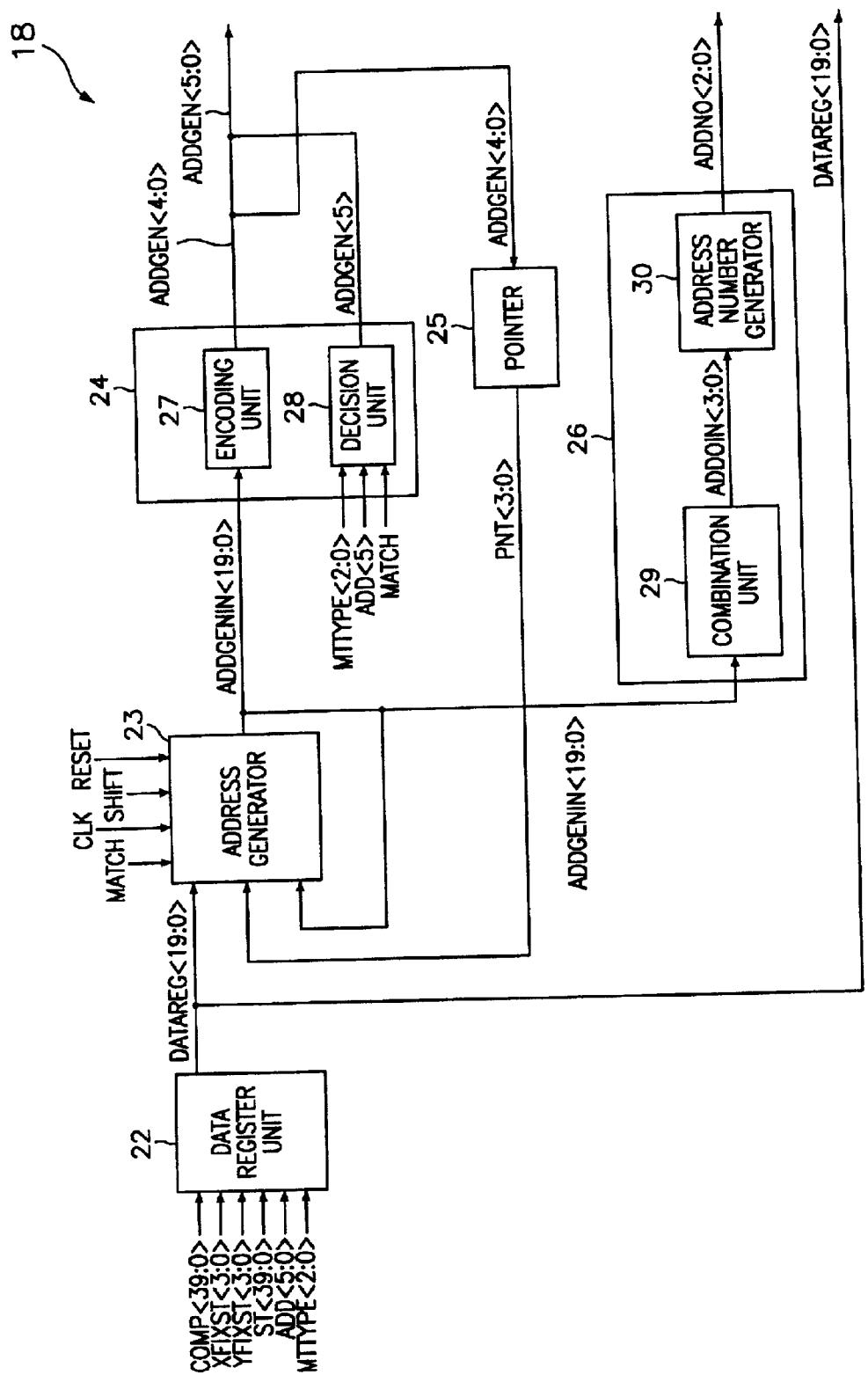
FIG. 6 is a block diagram of the data state comparator shown in FIG. 2.

FIG. 6 is a block diagram of the data state comparator shown in FIG. 2. The data state comparator 18 in the function block 10 includes a data register unit 22, an address generator 23, an address encoder 24, a pointer 25 and an address assignor 26. The data register unit 22 generates a register data DATAREG<19:0> by using the comparison data COMP<39:0>, the state data ST<39:0> and the row-fixed state data XFIXST<3:0> in response to the match type command data MTTYPE<2:0> and the address ADD<5:3>. The address generator 23 creates a match address data ADDGENIN<19:0> by using the register data DATAREG<19:0> in response to a match command signal MATCH, a reset signal RESET and a shift signal SHIFT with being synchronized with the clock signal CLK. The address encoder 24 encodes the address input data ADDGENIN<19:0> so that The address encoder 24 generates address data ADDGEN<5:0>. The pointer 25 generates point data PNT<3:0> erasing the address input data ADDGENIN<19:0> in response to the address data ADDGEN<4:0> outputted from the address encoder 24. The address number assignor 26 generates an address number data ADDNO<2:0> having address information in accordance with the address input data ADDGENIN<19:0>.

The data register 22 divides the comparison data COMP<39:0> into two sets of COMP<19:0> and COMP<39:20>, and divides the state data ST<39:0> into two sets of ST<19:0> and ST<39:20>, and then generates the register data DATAREG<19:0>. Here, DATAREG<0>, <5>, <10>, and <15> are assigned to the main register data, and assigned to row or column in accordance with the match type command data MTTYPE<2:0>. Accordingly, the rest of the register data DATAREG<19:0> are assigned to the sub register data.

The register data DATAREG<19:0> are determined by combinations of the comparison data COMP<39:0>, the state data ST<39:0>, the row fix state data XFIXST<3:0> and the column fixed state data YFIXST<3:0>, and assigned to row or column in accordance with the address ADD<5:3>. The main register data DATAREG<0>, <5>, <10>, and <15> are variable in accordance with the match type command data MTTYPE<2:0>, that is [000,001] in the case of a main match state, [100,101] in the case of a fix state, [111,111] in the case of an empty state, or [110,110] in the case of a state counting state. The sub register data DATAREG<4:1>, <9:6>, <14:11>, and <19:16> are valued in accordance with the match type command signal MTTYPE<2:0> in the case of a sub match state.

For example, the comparison data COMP<0> and <20> are existed in the valid state and the row and column fixed state data, XFIXST<3:0> and YFIXST<3:0> are all [0], when DATAREG<0> of the register data DATAREG<4:0> is for the main match state. If DATAREG<0> is in the empty state, the state data ST<0> and <20> are all [0]. If the DATAREG<0> is in the counting state, the state data ST<0> and <20> are existed in the valid state. DATAREG<4:1> among the register data DATAREG<4:0> is determined by considering only the sub match state, that is determined by considering a case in which the comparison data COMP<4:1> and <24:21> are existed in the valid state and a case in which the row and column fixed state data XFIXST<3:0> and YFIXST<3:0> are existed in the valid state. The other register data DATAREG<19:5> are determined by the manner as same as that for the DATAREG<4:0>.

The address generator 23 receives the register data DATAREG<19:0> (e.g., [00001000010000100001]) in response to an activation of the match command signal MATCH. If the shift command signal SHIFT is enabled, the address input data ADDGENIN<19:0> are applied to the address generator 23 again through a feedback loop, and then converted into [00001000010000100000] after being erased by the point data PNT<3:0>. If the shift command signal SHIFT is activated again, the address input data ADDGENIN<19:0> are converted into [00001000010000000000] by being erased by the point data PNT<3:0> outputted from the pointer 25.

The address encoder 24 includes an encoding unit 27 for generating the address data ADDGEN<4:0> by encoding the address input data ADDGENIN<19:0>, and a decision unit 28 for generating the address data ADDGEN<5>. The address data ADDGEN<5> determines that the encoded address data ADDGEN<4:0> are assigned to the row match state or the column match state in accordance with the match type command data MTTYPE<2:0> and the address ADD<5>. The encoding unit 27 extracts the address data ADDGEN<4:0> from the address input data ADDGENIN<19:0> through an encoding process. The decision unit 28 compares the match type command data MTTYPE<2:0> with the address ADD<5>, thereby determining ADDGEN<4:0> for row or for column, after the match command signal MATCH is activated.

The pointer 25 designates a representative bits location in the address data ADDGEN<4:0>. As an example, assumed that ADDGEN<4:0> is [01111], the representative address data is ADDGEN<4:3> that is [01], and the point data PNT<3:0> corresponding to the representative address data ADDGEN<4:3> is [0010] regardless of the main entry or the sub entry in the data. Since the address data ADDGEN<4:0> including the representative bits location has been outputted, the point data PNT<3:0> erases the register data DATAREG<19:0> corresponding to the representative bits location and outputs the next address input data DATAGENIN<19:0> in response to the shift command signal SHIFT, in order to generate the next address data ADDGEN<4:0>, which is repeatedly performed until the shifting operation is over.

The address number assignor 26 includes the combination unit 29 formed of four OR gates (not shown) which combines the address input data ADDGENIN<19:0> into sets of five bits, each set of which becomes address number input data ADDNOIN<4:0>, and address number generator 30 for generating the address number data ADDNO<2:0> as a counting information from the combined address number input data ADDNOIN<4:0>.

For example, when current match type is a row count match type, a counting information corresponding to the register data DATAREG<0> of ST<1>, <6>, <11>, and <16> is selected in accordance with ADD<5:3>. Accordingly, the counting information for other register data DATAREG<5>, <10>, and <15> are obtained by the manner aforementioned. Thereby, the number of the state data according to the counting information about the register data can be obtained. Assuming that the combined data ADDNOIN<3:0> is [0010], the address number data ADDNO<2:0> of [001] is generated. If ADDNOIN<3:0> is [0110], ADDNO<2:0> is [010]. ADDNOIN<3:0> of [1110] makes ADDNO<2:0> be [011].

An operation mode in the data state comparator 18 is composed in accordance with the match type command data MTTYPE<2:0> that is: (a) [000,001] of the case being matched to the main entry; (b) [100,101] of the case being fixed to the main entry; (c) [010,011] of the case being matched to the sub entry; (d) [110,110] of the case counting the state value; and (e) [111,111] of the case emptying the state value.

Data patterns of the match type command data MTTYPE<2:0> may be arranged in TABLE 3 as follows;

TABLE 3

| Command | Data |
|---|---|
| Match the main entry of the entry storage units 11a~11d | 000 |
| Match the main entry of the entry storage units 11e~11h | 001 |
| Fix the main entry of the entry storage units 11a~11d | 100 |
| Fix the main entry of the entry storage units 11e~11h | 101 |
| Match the sub entry of the entry storage units 11a~11d | 010 |
| Match the sub entry of the entry storage units 11e~11h | 011 |
| Count the state of the entry storage units 11a~11d | 110 |

TABLE 3-continued

| Command | Data |
| --- | --- |
| Count the state of the entry storage units 11e~11h | 110 |
| Empty the state of the entry storage units 11a~11d | 111 |
| Empty the state of the entry storage units 11e~11h | 111 |

The data state comparator 18 can carry out various operations because it compare the data but compares the state values. The data state comparator 18 combines the comparison data COMP<39:0> in accordance with the match type command data MTTYPE<2:0> (refer to TABLE 3). For example, if the comparison data COMP<39:0> is existed with no presence of the fixed state data XFIXST<3:0> or YFIXST<3:0> (data informing a processor that data has been stored in the entry storage units), a newly designated value of one bit in DATAREG<19:0> becomes [1]. If there is no value of COMP<39:0>, a newly designated value of one bit in DATAREG<19:0> is [0].

The data state comparator 18 combines the state data ST<39:0> only with state bits regardless of practical data, being situated on a data empty state in the case (d) and on a counting state in the case (e). The state data ST<39:0> is written in the bit locations No. 0 (i.e., 1'st), No. 5 (6'th), No. 10 (11'th), and No. 15 (16'th) in the new register data DATAREG<19:0>. The match type command data MTTYPE<2:0>, the comparison data COMP<39:0> and the state data ST<39:0> combine the address ADD<5:3> into the register data DATAREG<19:0>.

The newly established register data DATAREG<19:0> is utilized to output address values that are matched to the data, and to define the values with subtracting one bit from the data state value.

First, in the case of outputting the address values matched to the data, the encoding unit 27 is employed therein. The encoding unit 27 converts the register data DATAREG<19:0> into the address data ADDGEN<4:0>. Thus, it is easy to design a 6-bit address decoder (e.g., the decision unit 28).

The match signal MATCH is enabled, and then a prior value is assigned to the 20-bit register data DATAREG<19:0> synchronously with a falling edge of the clock signal CLK. The first value is erased, and an address corresponding to the next value is outputted, when the shift signal SHIFT that commands the state data ST<39:0> to be turned out is enabled. For example, assuming that the state values for the register data DATAREG<19:0> and the address data ADDGEN<5:0> are [00001000010000100001] and [011000], respectively, the register data DATAREG<19:0> and the address data ADDGEN<5:0> are converted each into [00000000010000100001] and [010000], when the match signal MATCH is disabled and the shift signal SHIFT is enabled.

Therefore, address information about the comparison data COMP<39:0> and the state data ST<39:0> is obtained from values combined with the match type command data MTTYPE<2:0> and the address ADD<5:3>.

In the case of calculating the value of the state data ST<39:0> (e), which is carried out with the value of the register data DATAREG<19:0>. The value of [1] is expressed in 3 bits because 4 bits are unavailable.

The controller 7 receives ADDGEN<5:0>, ADDNO<2:0>, and DATAREG<19:0> from the data state comparator 18, and then generates a read-out control signal RD, a write-in control signal WR, and an erasure control signal ER which are applied to the CAM 6 and the data buffer 5. Accordingly, the CAM 6 performs functions of moving, exchanging, and rearranging the fail address data FAD.

Each of the entry storage units 11a~11h in the entry storage block 8 of the CAM 6 includes the fixed flag store 16a for holding a fixed flag that fixes a redundancy mode for row or column corresponding to a detection result in which the number of defective cells is over than 5 after performing a fail test for a unit of row or column. Such a fixed flag needs a fuse operation for row or column when the more-five defective cells are presented on a row or a column during the fail test.

Figure 7A:
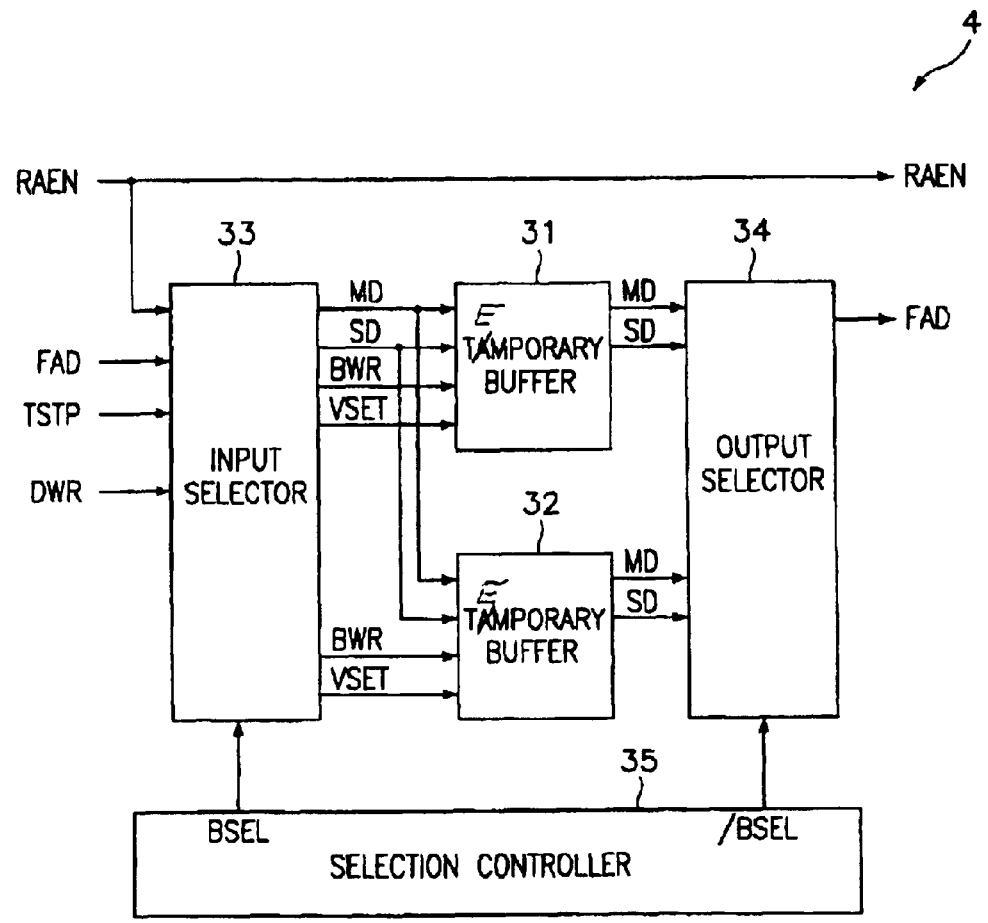
FIG. 7A is a block diagram of the temporary buffer unit shown in FIG. 1.

FIG. 7A shows a functional construction of the temporary buffer unit 4, including two temporary buffers 31 and 32 for storing the fail address data FAD established from the fail test performed in the test block 1, an input selector 33 for applying the fail address data FAD to an alternative one of the temporary buffers 31 and 32, an output selector 34 for outputting an alternative one of outputs from the temporary buffers 31 and 32, and a selection controller 35 for controlling the input and output selectors 33 and 34.

Figure 7B:
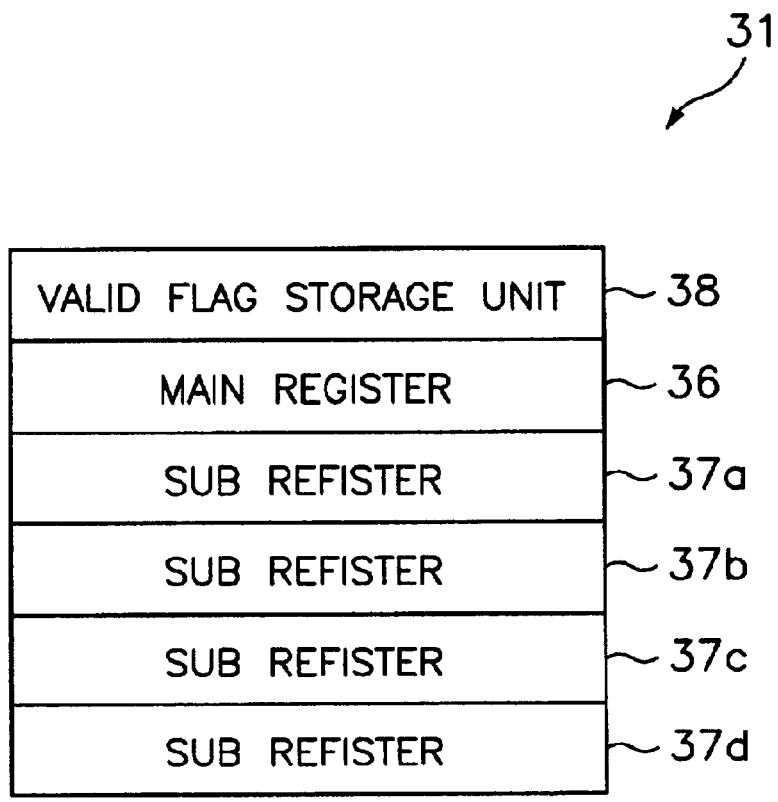
FIG. 7B is a block diagram of the temporary buffer employed in the temporary buffer unit of FIG. 7A.

FIG. 7B is a block diagram of the temporary buffer employed in the temporary buffer unit of FIG. 7A. The temporary buffer 31 comprises a main register 36, four sub registers 37a~37d, and a valid flag storage unit 38 for storing a valid flag representing states of data that are settled in the registers 36, 37a~37d and used in performing the repair analysis. The number of the sub registers 37a~37d, being embodied with four, corresponds to the number of redundant rows or columns.

The input selector 33 applies the row fail address data FAD to the main register 36 as main data MD, and applies the column fail address data FAD to the sub registers 37a~37d as sub data SD, in response to the test type signal TSTP of low level, when a current test type is to proceed a test operation in which column addresses are varied in the state of a fixed row address.

To the contrary, when a current test type is to proceed a test operation in which row addresses are varied in the state of a fixed column address, the input selector 33 applies the column fail address data FAD to the main register 36 as the main data MD, and applies the row fail address data FAD to the sub registers 37a~37d as the sub data SD, in response to the test type signal TSTP of high level. And the input selector 33 applies a buffer write-in signal BWR to the temporary buffer 31 (or 32) to make the temporary buffer store the main and sub data MD and SD into the main register 36 and the sub registers 37a~37d, respectively, in response to data write-in signal DWR.

When a repair analysis enable signal RAEN is provided from the controller 7, the test operation is turned to the next cycle for the next unit of row (or column), and a repair analysis for the fail cells involved in the prior row (or column) is conducted. The valid flag is set up to inform that there is data to be operated when valid data set signal VSET is applied to the temporary buffer 31 (or 32) from the input selector 33. The input and output paths through the temporary buffers 31 and 32 are dependent upon a level state of buffer selection signal BSEL provided from the selection controller 35.

The selection controller 35 applies the buffer selection signal BSEL and the complementary buffer selection signal/BSEL to the input selector 33 and the output selector 34, respectively.

The one of the temporary buffers 31 and 32 stores the fail address data FAD while the other one of the temporary buffers 32 and 31 outputs the fail address data FAD in order to perform the repair analysis. Accordingly, the test operation and the repair analysis are performed at the same time.

Now, the repair analysis will be explained hereinafter.

If a fail cell is found out through a test operation in the unit of a row (or a column) by the test block 1, the fail address data FAD assigned to the fail cell is written in the temporary buffer 31 (or 32) that is emptied in response to the data write-in signal DWR. Selecting the emptied temporary buffer is controlled by the buffer selection signal BSEL.

The test operation in the previous unit of row (or column) is completed, and then the test operation in the present row (or column) is performed. If there is a fail cell on the present row (or column), the fail address data FAD for the previous fail cell is stored in the rest temporary buffer 32 (or 31) not in the temporary buffer 31 (or 32) which has stored the fail address data FAD for the fail cell detected in the prior test cycle, in response to DWR again. At the same time, the fail address data FAD for the previous fail cell is transferred to the data buffer 5 from the temporary buffer 31 (or 32), and then a repair analysis for the previous test in the unit of row (or column) be performed.

The aforementioned procedure is repeated for other rows (or columns) in sequence.

Figure 8:
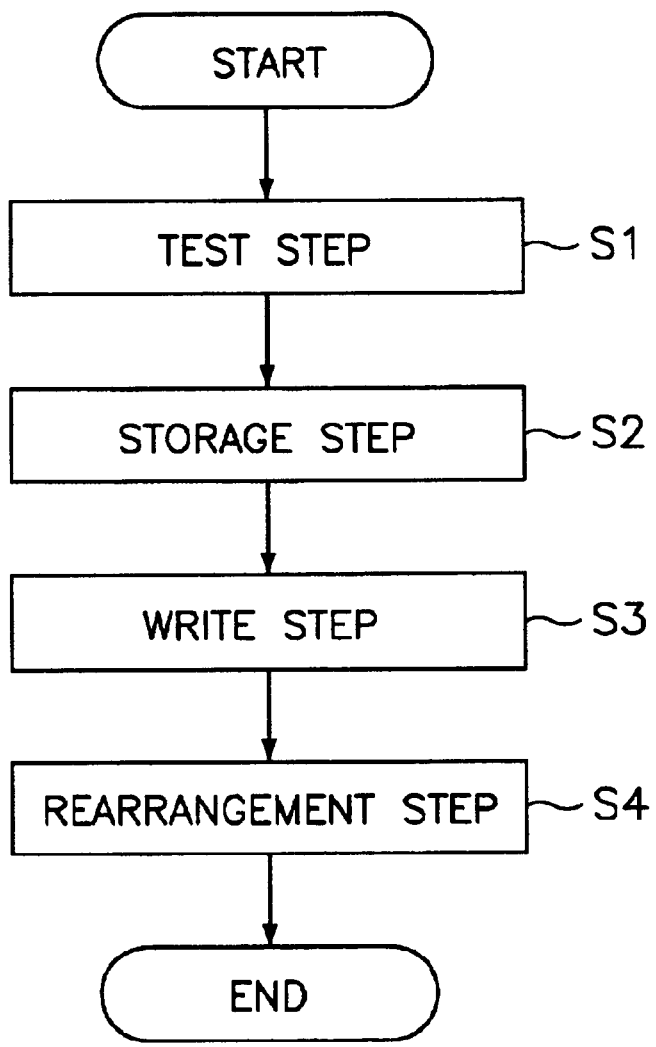
FIG. 8 is a flow chart for performing a repair analysis using the system of FIG. 1.

Those operations will be more described in conjunction with FIG. 8 and so on.

FIG. 8 is a flow chart for performing a repair analysis using the system of FIG. 1. At a test step S1, the fail address data FAD is stored in the temporary buffer unit 4 after a test cycle for a unit of row.

At a storage step S2, the fail address data FAD for defective cells detected in the test step S1 is written into a data buffer 5.

At a write step S3, the fail address data FAD stored in the data buffer 5 is written into the CAM 6.

At an rearrangement step S4, the fail address data FAD stored in the CAM 6 is moved and exchanged.

After finishing the data rearrangement step S4, the steps from S1 to S4 are repeated for the next unit of row.

The sequence for transferring the fail address data FAD stored in the temporary buffer 31 (or 32) to the storage step S2 is as follows.

If a row fail address data FAD of the temporary buffer unit 4 is identical to that of the main entry store 12a in the entry storage units 11a~11h of the CAM 6, the fail address data FAD of the main entry store 12a and the sub entry stores 13a~13d are transferred to the data buffer 5, and then the fail address data FAD of the temporary unit 4 are transferred to the data buffer 5. Such a procedure is operable in performing a burn-in test as the first stage and a special test as the second stage, in order.

If a row fail address data FAD of the temporary buffer unit 4 is deferent from that of the main entry store 12a in the entry storage units 11a~11h of the CAM 6 while these are identical to that of the sub entry stores 13a~13d in the entry storage units 11a~11h of the CAM 6, the identical data of the sub entry stores 13a~13d and that of the main entry store 12a corresponding to the identical data of the sub entry stores 13a~13d are transferred to the data buffer 5, and then the data of the temporary buffer unit 4 are transferred to the data buffer 5. Such procedures during the storage step S2 are operable in performing a burn-in test as the first stage, or in performing a special test as the second stage, because it may occur that a cell that has been regarded to be failed through the first test stage is detected as a non-failed cell in the second test stage.

If the data of the temporary buffer unit 4 is different from that of the main entry store 12a of the entry registers 11a~11d and of the sub entry stores 13a~13d of the entry registers 11e~11e, the data of the temporary buffer unit 4 is transferred to the data buffer 5.

The rearrangement step S4 performs the rearranging operation for the entry registers 11a~11h before the fail address data FAD supplied from the data buffer 5 is written in the CAM 6, in order to prepare the repair analysis that is subsequent thereto.

Figure 9:
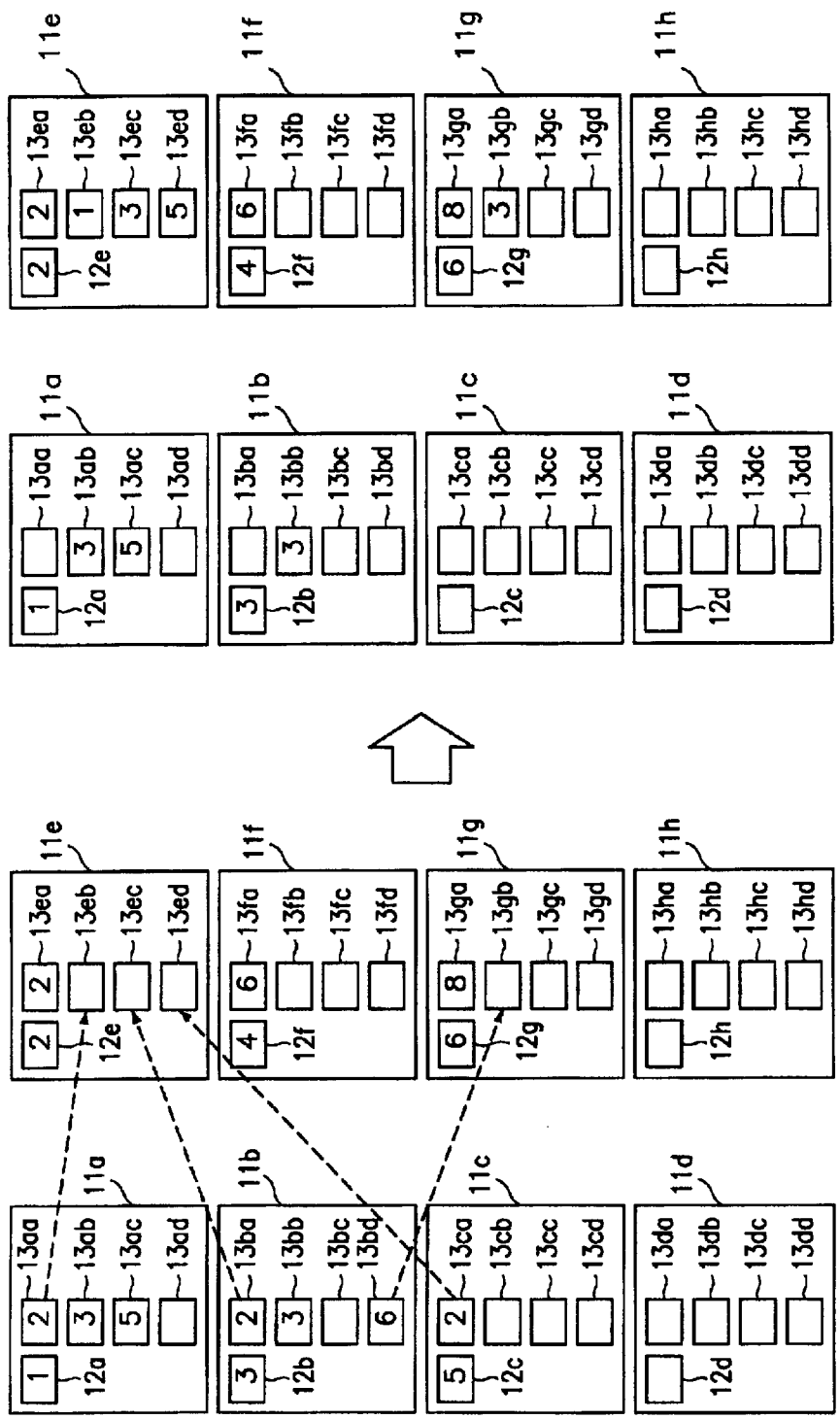
FIG. 9 is a schematic diagram illustrating a manner for arranging the entry storage unit, as an example of the step incoming entries in FIG. 8.

FIG. 9 explains a procedure rearranging data structures of the entry storage units 11a~11h at the rearrangement step S4. Accordingly, the sub entry stores 13a~13d in the entry storage units 11a~11d store the column fail address data FAD while the sub entry stores 13a~13d in the entry storage units 11e~11h store the row fail address data FAD. If the current test stage is a row scan test, the data patterns rearranged in the entry storage units 11a~11d are applied to the entry storage units 11e~11h.

Namely, if the fail address data FAD of the sub entry stores 13aa~13dd of the entry storage units 11a~11d are identical to the main entry stores 12e~12h of the entry storage units 11e~11h, the data of the main entry stores 12a~12d corresponding to the identical data of the sub entry stores 13aa~13dd of the entry storage units 11a~11d are transferred to the sub entry stores 13ea~13hd of the entry storage units 11e~11h corresponding to the identical data of the sub entry stores 13aa~13dd of the entry storage units 11a~11d.

As shown in FIG. 9, since the column fail address data "2" (it means the second column has a defective cell) and "6" (it means the sixth column has a defective cell) in the sub entry stores 13aa, 13ba, 13bd and 13ca of the entry storage units 11a~11c are identical to the column fail address data "2" and "6" in the main entry stores 12e and 12g of the entry storage units 11e and 11g, the row fail address data "1" (it means the first row has a defective cell), "3", and "5" of the entry storage units 11a, 11b, and 11c are transferred to their corresponding sub entry stores 13eb, 13ec and 13ed of the entry storage units 11e and 11g. That is, the row fail address data "1", "3", and "5" are transferred into the sub entry stores 13eb, 13ec, and 13ed of the entry storage unit 11e, respectively. Also, the row fail address data "3" of the main entry store 12b in the entry storage unit 11b is transferred to the sub entry store 13gb of the entry storage unit 11g. The reason of performing the rearrangement is that the data stored in the data buffer 5 has one row address and four column addresses.

Meanwhile, in case that the current test stage is a column scan test, the entry storage units 11e~11h are rearranged and then the resulting data pattern is applied to the entry storage units 11a~11d, as the row scan test operation does.

After rearrangement operation are completed, state flags informing that the main or sub entry stores 12 and 13a~13d are unoccupied with data are stored in the state flag stores 14a and 15a~15d, enabling the main and sub entry stores to be filled with new data.

Figure 10A:
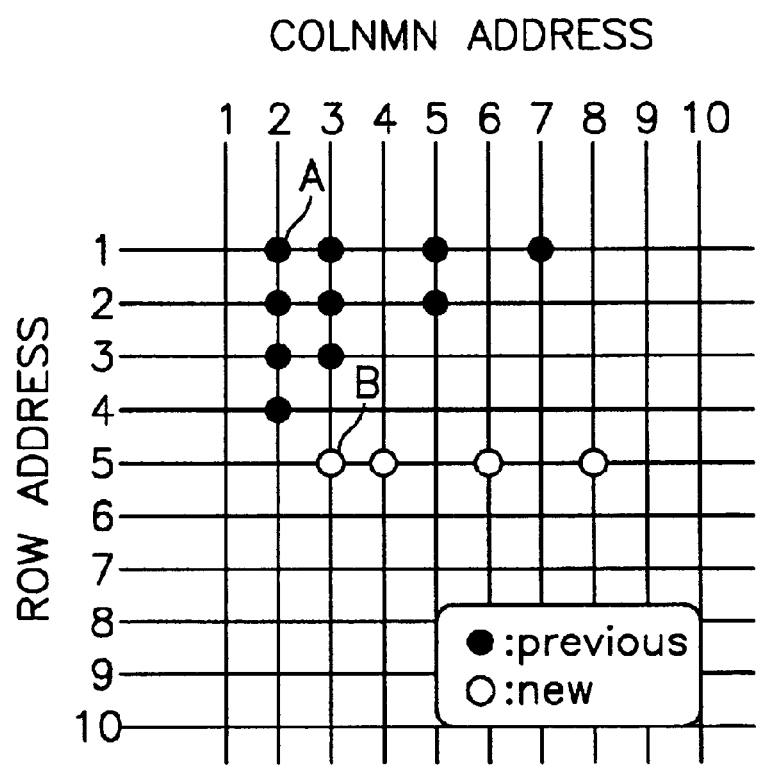
FIGS. 10A and 10B are schematic diagrams illustrating data move patterns, as an example of rearranging with the incoming entries in the flow of FIG. 8.
Figure 10B:
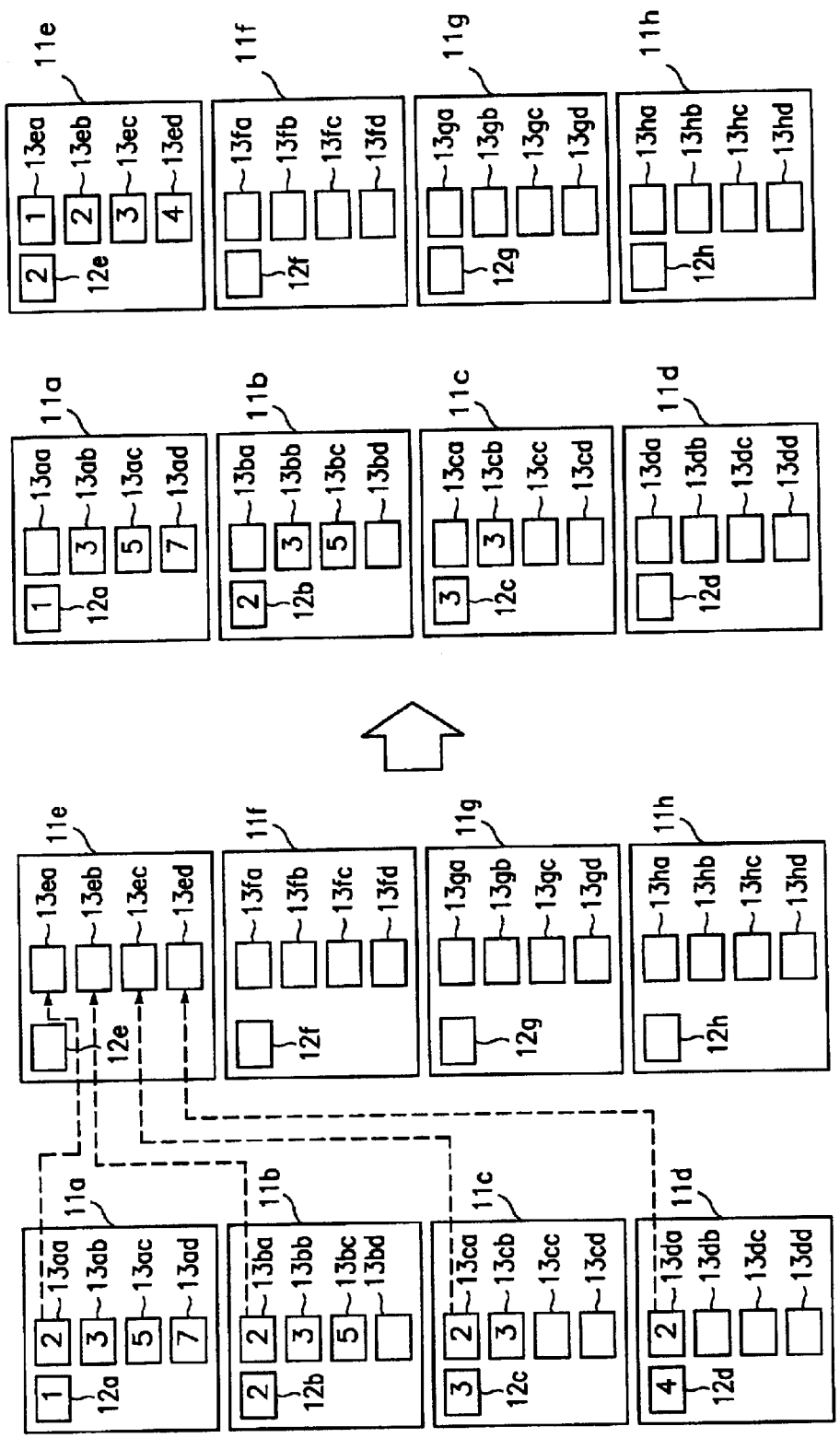

FIGS. 10A and 10B show the features of moving the data for the data rearrangement in the entry storage units.

Referring to FIG. 10A, the points A denote locations of defective cells detected from the prior test stage (e.g., the burn-in test) and the points B designate locations of defective cells found out in the current test stage (e.g., the special test).

As shown in FIG. 10A, when cells which are positioned on the second, the third, the fifth and the seventh columns on the first row, on the second, the third, and the fifth columns on the second row, the second and third columns on the third row and on the second column on the fourth row, are defined as failed in the first test stage, and cells which are positioned on the third, the fourth, the sixth, and the eighth columns on the fifth row are defined as failed in the second test stage, there is no space for storing the address data of the fail cells because the entry storage units 11a~11d just have four main entry stores 12a~12d. The row fail address data FAD for the fail cells on the first, the second, the third and the fourth rows are stored to the main entry stores 12a~12d of the entry storage units 11a~11d, respectively, and the column fail address data FAD corresponding to fail rows are stored to the sub entry stores 13aa~13hd corresponding to their main entry stores by the number of fail columns, respectively, as shown in FIG. 10B.

The column fail address data FAD of the sub entry store 13da of the entry storage unit 11d moves to the main entry store 12e of the entry storage unit 11e. At this time, the column fail address data FAD being identical with the column fail address data FAD stored in the sub entry store 13da is moved to the sub entry stores 13eb, 13ec and 13ed.

As a result, the main entry store 12d and the four sub entry stores 13da~13dd of the entry register 11d are entirely emptied. Thus, the fail address data FAD detected in the fifth row, i.e., the four column fail address data FAD (i.e., "3", "4", "6", and "8") can be settled in the sub entry stores 13da~13dd and the fourth main entry store 12d of the entry register 11d.

Figure 11A:
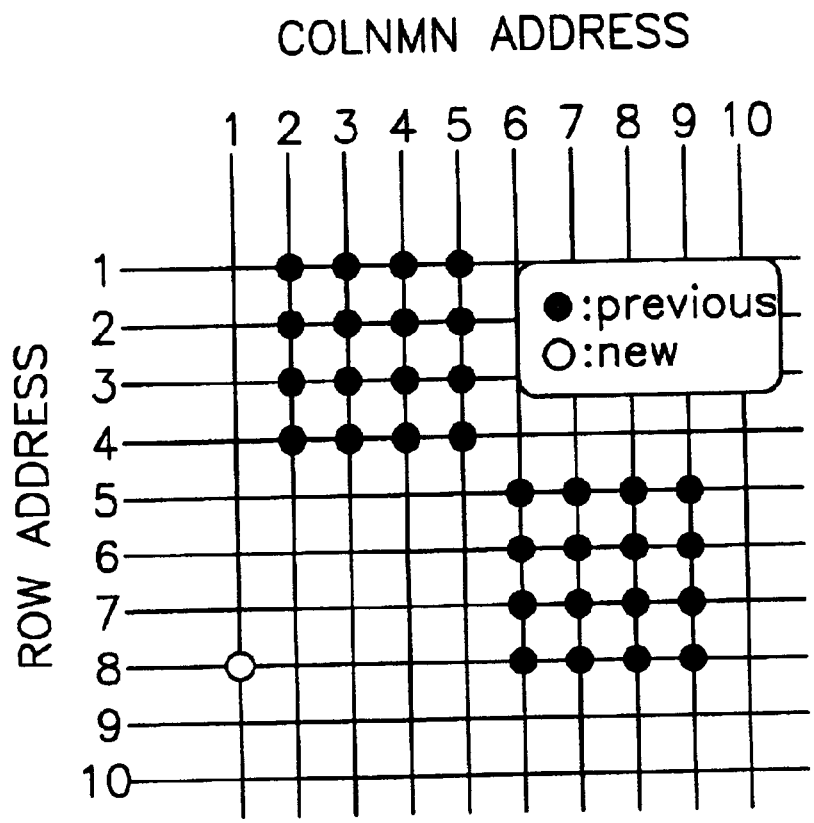
FIGS. 11A and 11B are schematic diagrams illustrating data exchange patterns, as an example of rearranging with the incoming entries in the flow of FIG. 8.
Figure 11B:
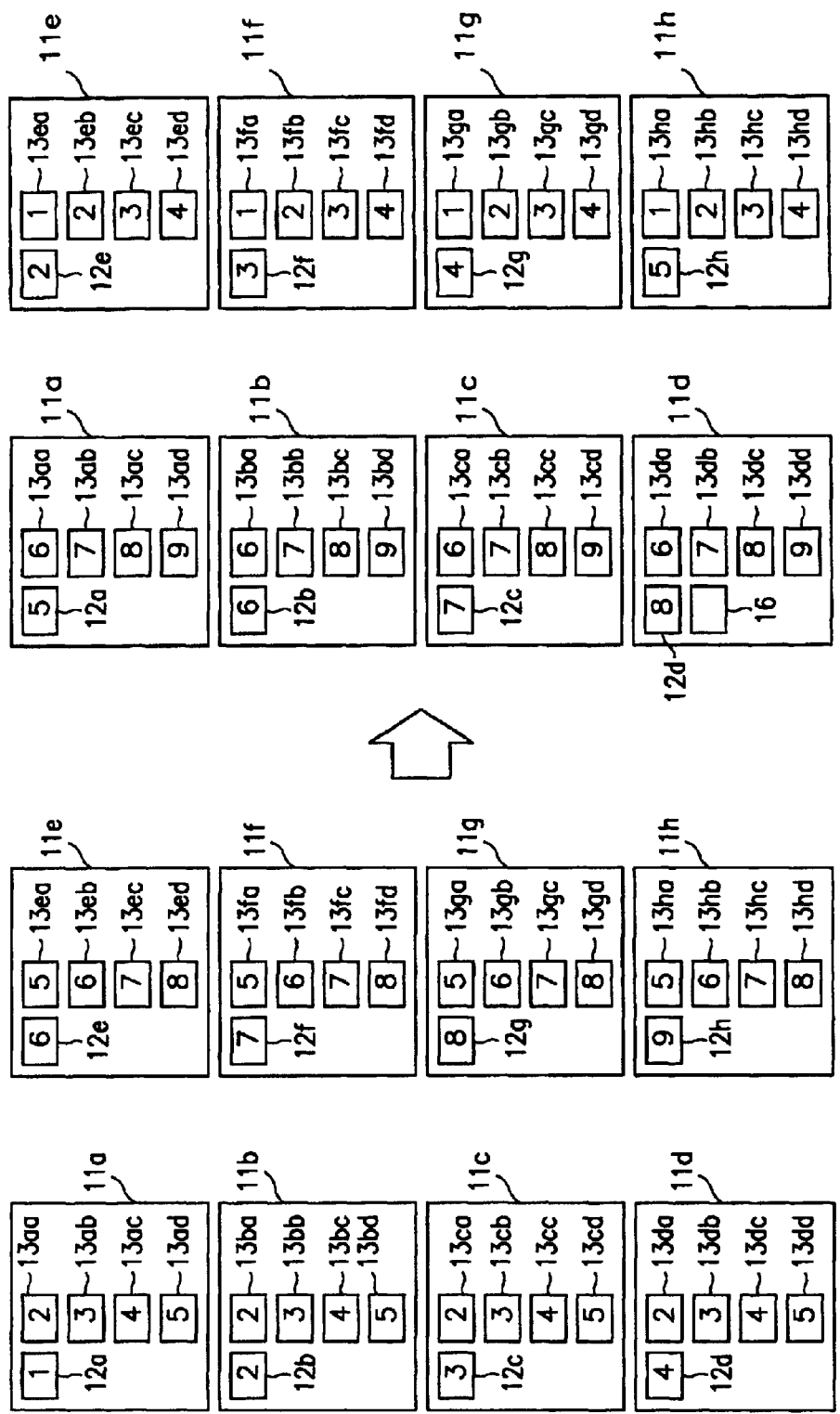

FIGS. 11A and 11B shows the features of the data exchange during the data rearrangement in the entry storage units 11a~11d, as an embodiment of the present invention. Defective cells A defined through the first test stage (e.g., the burn-in test) are positioned on columns from the second to the fifth and on rows from the first to the fourth, and on columns from the sixth to the ninth and on rows from the fifth to the eighth. Defective cells B defined through the second test stage (e.g., the special test) are positioned on the first column and the eighth row.

There is no space for the fail address data FAD on the eighth row and the first column detected from the second test stage because the eighth row has five defective cells through both the first and second test stages. Therefore, the row has to be fixed. However, the main entry stores 12a~12d of the entry storage units 11a~11d do not involve the row fail address data FAD on the eighth row.

Accordingly, the fail address data FAD of the entry storage units 11a~11d are exchanged with the fail address data FAD of the entry storage units 11e~11h, and then the fixed flag store 16a makes the eighth row fuse be used unconditionally.

The exchanged and fixed operations are performed as follows,
 a) The data of the entry storage units 11a~11d are transferred into the data buffer 4.
 b) The data of the entry storage units 11a~11d are erased.
 c) The data of the entry storage units 11e~11h are transferred into the entry storage units 11a~11d with matching the patterns of the row and column fail address data FAD.
 d) The data stored in the data buffer 4 are transferred into the entry storage units 11e~11h with matching the patterns of the row and column fail address data FAD.

While this, if it is impossible to write the fail address data FAD in the CAM 6 from the data buffer 4, the memory chip currently being tested may be not available to be repaired.

Figure 12:
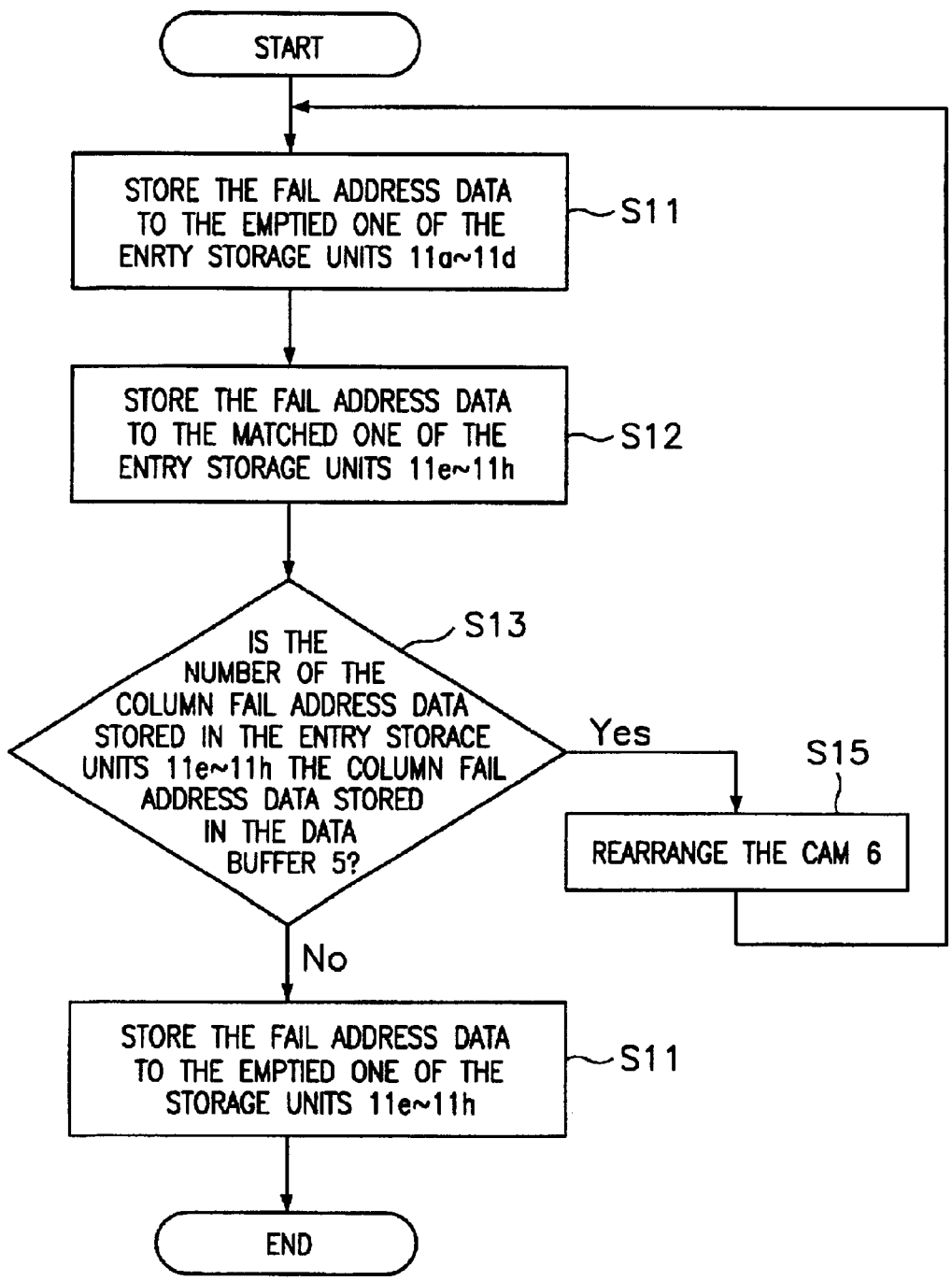
FIG. 12 is a flow chart for writing data from the data buffer to the CAM, as an example of the step of a repair analysis.

FIG. 12 shows a flow of the repair analysis carrying out the write step S3 of FIG. 8.

First, at step S31, the data stored in the data buffer 5 are stored in an emptied one of the entry storage units 11a~11d. The occupation states of the entry storage units 11a~11d are detected by checking out a presence of state flags in the main and sub state stores 14a and 15a~15d.

Next, at the step S32, if the column fail address data FAD in the data buffer 5 are identical with the data of the main entry stores 12e~12h of the entry storage units 11e~11h, the row fail address data FAD corresponding to the identical column fail address data FAD in the data buffer 5 are transferred to the sub entry stores 13ea~13hd corresponding to the main entry store 12e~12h stored the identical data.

The step S32 would be repeated in accordance with the number of the coincident column fail address data FAD.

The data comparators 17a~17h in the function block 10 of the CAM 6 compare the column fail address data FAD stored in the data buffer 5 and the column fail address data FAD stored in the main entry stores 12e~12h of the entry storage units 11e~11h. The data BS<7:0> generated by decoding the address ADD<5:3> in the decoder 9 selects the one of the entry storage units 11e~11h. The address ADD<2:0> is utilized for determining that the current data being compared are stored in the main entry stores or in the sub entry stores.

The data state comparator 18 generates the address number data ADDNO<2:0>, the address data ADDGEN<5:0> and the register data DATAREG<19:0> by using the comparison data COMP<39:0>.

At the step S33, the number of the sub entry stores 13ea~13hd of the main entry stores 12e~12h in the entry storage units 11e~11h are compared with that of the column fail address data FAD in the data buffer 5. Here, the number of the sub entry stores 13ea~13hd are that of the sub state stores 15ea~15hd stored valid state flags.

If the number of the sub state stores 15ea~15hd stored valid state flags is larger than that of the column fail address data FAD of the data buffer 5, the column fail address data FAD of the data buffer 5 are written into the empty main entry stores 12e~12h in the entry storage units 11e~11h, at the step S34.

However, if all of the column fail address data FAD of the data buffer 5 could not write into the empty main entry stores 12e~12h in the entry storage units 11e~11h, at the step S34, the step S31 is again performed.

On the other hand, the number of the sub state stores 15ea~15hd stored valid state flags is less than that of the column fail address data FAD of the data buffer 5, the CAM 6 is rearranged, at the step S35, and then the step S31 is again performed.

Since the embodiment of the invention employs four redundant columns and four redundant rows, the row in which the more than five defective cells are detected must be repaired as the redundant row. In this manner, the column in which the more than five defective cells are detected must be repaired as the redundant column.

Thus, the temporary buffer 31 (or 32) of the temporary buffer unit 4 is formed by the one main register 36 and the four sub registers 37a~37d. The main register 36 stores the row (or column) address tested in the present. The sub registers 37a~37d store the address of the defective cells on row (or column) tested in the present.

Accordingly, the repair analysis operation for the first row as an example is performed during a test operation for the second row is being progressed. That is, the fail address data FAD generated from testing for the second row are stored in the first temporary buffer 31 during fail address data FAD of defective cells on the first row are transferred to the data buffer 5 from the second temporary buffer 32. Consequently, the second row fail address data FAD stored in the first temporary buffer 31 are put into the redundancy analysis cycle while the fail address data FAD of defective cells on the fifth row is being stored in the second temporary buffer 32.

As described above, since the test operation and repair analysis operation are simultaneously performed in the present invention, the time for test operation can be reduced. And, the capability of the rearrangement, including the moving and exchanging between the column and row fail address data, enhances yields of the memory device.

Although specific constructions and procedures of the invention have been illustrated and described herein, it is not intended that the invention be limited to the elements and constructions disclosed. One skilled in the art will easily recognize that the particular elements or sub-construction may be used without departing from the scope and spirit of the invention.

What is claimed is:

1. A semiconductor memory device comprising:
    a test means for performing a test operation for an alternative one of row and column, detecting defective cells on the alternative unit of the row and column; and
    a repair analysis means for performing a repair analysis in which a failed-address data involved in defective cells on the alternative one of the row and column are rearranged with including moving and exchanging between the failed-address data in a unit of row and column;
    wherein the repair analysis means includes:
        a temporary buffer unit having a plurality of temporary buffers for storing the failed-address data for the defective cells;
        a data buffer receiving the failed-address data stored in one of the temporary buffers;
        a storage means receiving the failed-address data from the data buffer and for rearranging a structure of the failed-address data; and
        a controller for controlling operations of the temporary buffer unit, the data buffer and the data storage means.

2. The device of claim 1, wherein the temporary buffer unit includes:
    the temporary buffers for storing the failed-address data detected by the test means;
    an input selector for transferring the failed-address data into an alternative one of the temporary buffers from the test means;
    an output selector for transferring the failed-address data to the data buffer from an alternative one of the temporary buffers; and
    a controller for controlling operations of the input and output selectors.

3. The device of claim 2, wherein the temporary buffer includes:
    a main register for storing main address data determined by a scanning type of the test operation;
    a plurality of sub registers for storing sub address data determined by a scanning type of the test operation; and
    a flag registers for storing a flag informing of a presence of data in the main register.

4. The device of claim 1, wherein the data buffer includes:
    a main register for storing main address data determined by a scanning type of the test operation; and
    a plurality of sub registers storing sub address data determined by a scanning type of the test operation.

5. The device of claim 1, wherein the data storage means includes:
    an entry storage block for storing the failed-address data; and a function block for operating the rearrangement operation for the failed-address data stored in the entry storage block.

6. The device of claim 5, wherein the entry storage block includes a plurality of entry registers for storing the failed-address data.

7. The device of claim 6, wherein each of the entry registers includes:
    a main entry store for storing a main entry address data;
    a main state flag store for storing a flag informing of status of the main entry store;
    a plurality of sub entry stores for storing sub entry address data;
    a plurality of sub state flag store for storing flags informing of status of the sub entry stores; and
    a fix flag store for storing a fix flag for settling an alternative one of a redundant row and a redundant column designated by the main entry address data.

8. The device of claim 5, wherein the function block includes:
    a plurality of data comparators for comparing between the data stored in the data buffer and the data stored in the entry storage block; and
    a data state comparator for combining output signals supplied from the data comparators and applying the combined signals to the controller.

9. A semiconductor memory device having a repair analysis means for failed-address data assigned to defective cells on an alternative one of row and column and detected by performing a scanning test for the alternative one of the row and column, includes:
    a temporary buffer unit having a plurality of temporary buffers storing the failed-address data for the defective cells;
    a data buffer receiving the failed-address data stored in one of the temporary buffers;
    a data storage means receiving the failed-address data from the data buffer and rearranging a structure of the failed-address data; and
    a controller for controlling operations of the temporary buffer unit, the data buffer and the data storage means.

10. The device of claim 9, wherein the temporary buffer unit includes:
    the temporary buffers for storing the failed-address data;
    an input selector for transferring the address data to an alternative one of the temporary buffers;
    an output selector for transferring the failed-address data to the data buffer from an alternative one of the temporary buffers; and
    a controller for controlling selection operations of the input and output selectors.

11. The device of claim 10, wherein the temporary buffer includes:
    a main register for storing a main address data determined by a scanning type of the test operation;
    a plurality of sub registers for storing a sub address data determined by a scanning type of the test operation; and a flag register for storing a flag informing of a presence of data in the main register.

12. The device of claim 9, wherein the data buffer includes:
   a main register for storing the main address data determined by a scanning type of the test operation; and
   a plurality of sub registers for storing the sub address data determined by a scanning type of the test operation.

13. The device of claim 9, wherein the data storage means includes:
   an entry storage block for storing the failed-address data; and
   a function block for performing the rearrangement for the structure of the failed-address data.

14. The device of claim 13, wherein the entry storage block includes a plurality of entry registers for storing the failed-address data.

15. The device of claim 14, wherein each of the entry registers includes:
   a main entry store for storing a main entry address data;
   a main state flag store for storing a flag informing of status of the main entry store;
   a plurality of sub entry stores for storing sub entry address data;
   a plurality of sub state flag stores for storing flags informing of status of the sub entry stores; and
   a fix flag store for storing a fix flag for settling an alternative one of a redundant row and a redundant column designated by the main entry address data.

16. The device of claim 13, wherein the function block includes:
   a plurality of data comparators for comparing the data stored in the data buffer and the data stored in the entry storage block; and
   a data state comparator for combining output signals supplied from the data comparator and applying the combined signal to the controller.

17. A method of performing a repair analysis with failed-address data assigned to defective cells on an alternative one of row and column in a semiconductor memory device, comprising:
   storing the failed-address data into a temporary buffer unit;
   storing the failed-address data stored in the temporary buffer unit into a data buffer;
   writing the failed-address data stored in the data buffer into the storage block; and
   moving and exchanging the failed-address data stored in the storage block.

18. The method of claim 17, wherein the storing includes:
   first transferring the coincident row failed-address data and column failed-address data associated with the coincident row failed-address data into the data buffer, when the row failed-address data stored in the storage block is coincident with the row failed-address data stored in the temporary buffer unit;
   second transferring the coincident column failed-address data and row failed-address data associated with the coincident column failed-address data into the data buffer, when the column failed-address data stored in the storage block is coincident with the column failed-address data stored in the temporary buffer unit; and
   third transferring the data of the temporary buffer unit into the data buffer, when the failed-address data stored in the storage unit is different from the failed-address data stored in the temporary buffer unit.

19. The method of claim 18, wherein the first transferring is operable in a condition of progressing a first test stage and a second test stage in sequence.

20. The method of claim 18, wherein the second transferring is operable in a condition of progressing an unique test stage.

21. The method of claim 18, wherein the second transferring is operable in a condition of progressing a first test stage and a second test stage in sequence.

22. The method of claim 17, wherein the repair analysis includes:
   first transferring the data stored in the data buffer to first main entry stores of the storage block when the first main entry stores have emptied entry stores;
   second transferring the data stored in the data buffer to the second main entry stores which have the coincident data, when the data stored in second main entry stores are coincident with the data stored in the first sub entry stores, wherein the first sub entry stores store column failed-address data in the row scan test while row failed-address data in the row scan test;
   comparing the number of second sub entry stores associated with the first main entry stores of the storage block with the number of data stored in the first sub entry stores of the data buffer when it is unavailable to store the data of the data buffer into the storage block through the first and second storage steps;
   writing the data stored in the first sub entry stores of the data buffer into the second main entry stores when the number of the second sub entry stores associated with the first main entry stores of the storage block is larger than that of the data stored in the first sub entry stores of the data buffer;
   rearranging the data structure of the storage block when it is unavailable to store the data stored in the first sub entry stores of the data buffer into the second main entry stores of the storage; and
   second rearranging the data structure of the storage block when the number of the second sub entry stores associated with the first main entry stores of the storage block is less than that of data stored in the first sub entry stores of the data buffer.

23. The method of claim 22, wherein the first transferring determines whether or not the first main entry stores and the second sub entry stores are being emptied, by using state flags.

24. The method of claim 22, wherein the second transferring is repeated when there are a plurality of data stored in the first sub entry stores of the data buffer.

25. The method of claim 22, wherein the number of the second sub entry stores corresponds to the number of valid state flags, in the comparison step.

26. The method of claim 17, wherein the rearranging includes:
   first transferring data stored in the first main entry stores associated with the coincident data to first sub entry stores associated with the coincident data of the second main entry stores when the data stored in second sub entry stores associated with first main entry stores of the storage block are coincident with the data stored in second main entry stores; and
   second transferring data stored in the first main entry stores associated with the coincident data to first sub entry stores associated with the coincident data of the second main entry stores when the data stored in second sub entry stores associated with first main entry stores of the storage block are coincident with the data stored in second main entry stores.

* * * * *